United States Patent
Yamamoto et al.

(10) Patent No.: US 7,245,099 B2
(45) Date of Patent: Jul. 17, 2007

(54) ELECTRONIC APPARATUS THAT ALLOWS COOLING FAN TO BE DRIVEN WITH CERTAINTY EVEN AT THE TIME OF SOFTWARE MALFUNCTION/LOCK-UP OR AT THE TIME OF CONTROLLER FAILURE

(75) Inventors: Takehiko Yamamoto, Hiki-gun (JP); Akira Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 497 days.

(21) Appl. No.: 10/944,901

(22) Filed: Sep. 21, 2004

(65) Prior Publication Data
US 2005/0066672 A1 Mar. 31, 2005

(30) Foreign Application Priority Data
Sep. 25, 2003 (JP) ............................ 2003-334179

(51) Int. Cl.
G05B 5/00 (2006.01)
G06F 1/20 (2006.01)
H05K 7/20 (2006.01)

(52) U.S. Cl. ...................... 318/471; 318/472; 318/268; 388/811

(58) Field of Classification Search ................ 318/245, 318/254, 268, 471, 472; 388/809, 811; 706/52
See application file for complete search history.

(56) References Cited

U.S. PATENT DOCUMENTS

| | | | | |
|---|---|---|---|---|
| 3,736,796 A | * | 6/1973 | Hohenberg | ............... 73/178 T |
| 4,408,713 A | * | 10/1983 | Iijima et al. | ............... 236/49.3 |
| 5,726,874 A | * | 3/1998 | Liang | ........................ 363/141 |
| 6,040,668 A | * | 3/2000 | Huynh et al. | ............... 318/471 |
| 6,188,189 B1 | * | 2/2001 | Blake | ........................ 318/471 |
| 6,385,395 B1 | * | 5/2002 | Horng et al. | ............... 388/809 |
| 6,414,843 B1 | | 7/2002 | Takeda | |
| 7,098,617 B1 | * | 8/2006 | Oljaca et al. | ............... 318/268 |
| 2003/0137267 A1 | * | 7/2003 | Blake | ........................ 318/471 |
| 2003/0234630 A1 | * | 12/2003 | Blake | ........................ 318/471 |
| 2004/0027763 A1 | * | 2/2004 | Dhuey | ........................ 361/103 |
| 2004/0178759 A1 | * | 9/2004 | Nakamura et al. | .......... 318/471 |
| 2004/0239295 A1 | * | 12/2004 | Sumimoto et al. | ............ 322/34 |
| 2006/0181232 A1 | * | 8/2006 | Oljaca et al. | ............... 318/268 |
| 2007/0025707 A1 | * | 2/2007 | Lin et al. | .................... 388/811 |

FOREIGN PATENT DOCUMENTS

JP 2001-56724 2/2001

* cited by examiner

*Primary Examiner*—Paul Ip
(74) *Attorney, Agent, or Firm*—Pillsbury Winthrop Shaw Pittman, LLP

(57) ABSTRACT

A voltage for driving a cooling fan is usually output from a fan voltage control circuit. Whether to cause the fan voltage control circuit to output the drive voltage or not is controlled by a system management utility (software) and a bridge controller (hardware) on the basis of temperature data from a temperature sensor. To provide for the occurrence of a failure in the system management utility or the bridge controller, a temperature comparator monitors the temperature data from the temperature sensor and instructs a fan voltage control circuit to output a drive voltage for the cooling fan in the case where the temperature rises above a given value.

9 Claims, 2 Drawing Sheets

ELECTRONIC APPARATUS THAT ALLOWS COOLING FAN TO BE DRIVEN WITH CERTAINTY EVEN AT THE TIME OF SOFTWARE MALFUNCTION/LOCK-UP OR AT THE TIME OF CONTROLLER FAILURE

CROSS-REFERENCE TO RELATED APPLICATIONS

This application is based upon and claims the benefit of priority from prior Japanese Patent Application No. 2003-334179, filed Sep. 25, 2003, the entire contents of which are incorporated herein by reference.

BACKGROUND OF THE INVENTION

1. Field of the Invention

The present invention relates to a technique that controls the driving of a cooling fan used in an electronic apparatus such as a personal computer.

2. Description of the Related Art

In recent years, various types of personal computers, such as notebook computers and desktop computers, have come into wide use in offices and homes. In general, with these types of personal computers, a cooling fan is installed in the neighborhood of a central processing unit (CPU) in order to discharge air, the temperature of which has been elevated due to heat generated by the CPU, to the outside of the casing. Control of the cooling fan is carried out on the basis of temperature data output from a temperature sensor (see, for example, U.S. Pat. No. 6,414,843).

This allows appropriate cooling-fan control that allows for low-noise driving and low power consumption to be implemented (such as rotates the cooling fan only when necessary).

Up to now, the driving of the cooling fan has been controlled by a single controller. The controller receives commands associated with drive control of the cooling fan from software whenever necessary or drives the cooling fan as initialized by software.

With such a system, however, the occurrence of a malfunction or lock-up in the software or a failure in the controller will result in failure to perform the appropriate control of the cooling fan. In this case, as long as the cooling fan continues to rotate there is no problem, but if the cooling fan does not rotate at all, the function of protecting the CPU may not be performed.

With a large business-oriented server computer, it is possible to provide a dual cooling fan system; however, since this system inevitably causes the cost and size to be increased, it is not practical to provide the dual cooling fan system in a personal computer.

BRIEF SUMMARY OF THE INVENTION

According to an embodiment of the present invention, an electronic apparatus comprises a fan drive circuit which drive controls a cooling fan, first and second fan voltage control circuits each of which outputs a drive voltage required for the fan drive circuit to drive the cooling fan, a temperature sensor, a system controller which drive controls the first fan voltage control circuit on the basis of temperature data received from the temperature sensor, and a temperature comparator which acquires the temperature data transferred toward the system controller and, when the temperature is above a given value, drive controls the second fan voltage control circuit to output the drive voltage without intervention of the system controller.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

An embodiments of the present will be described hereinafter with reference to the accompanying drawings.

Figure 1:
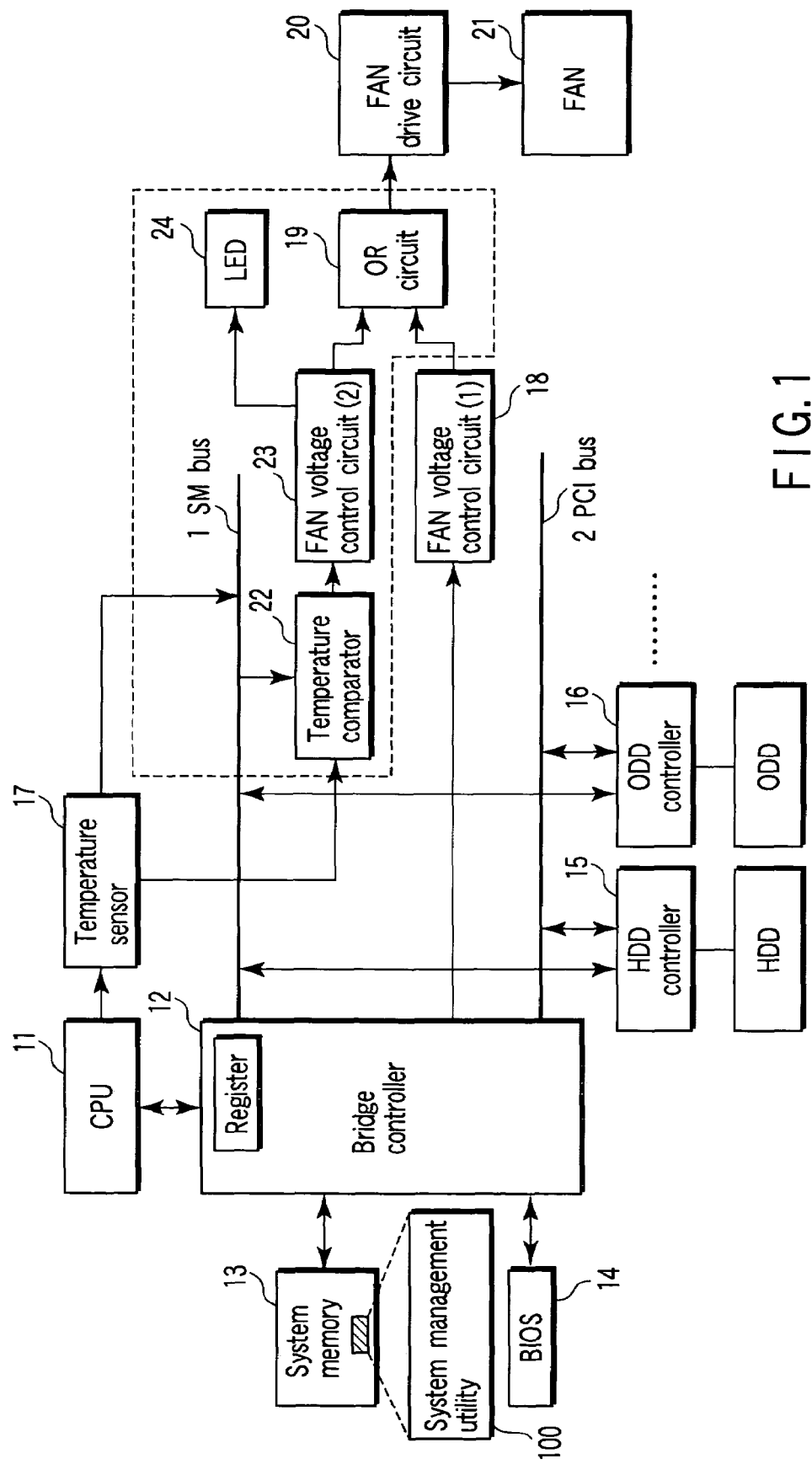
FIG. 1 is a block diagram of the portion associated with cooling fan control of an electronic apparatus according to an embodiment of the present invention.

FIG. 1 shows, in block diagram form, the portion associated with cooling fan control of an electronic apparatus according to an embodiment of the present invention.

This electronic apparatus, which is, for example, a notebook-type personal computer, is subject to overall control by a CPU 11. In the electronic apparatus, a system management (SM) bus 1 and a peripheral component interconnect (PCI) bus 2 for data transmission and reception are installed. A bridge controller 12 has a bridge function of connecting the SM bus 1 and the PCI bus 2 with the high-speed local bus of the CPU 11.

A system memory 13 and a BIOS-ROM 14 are connected to the bridge controller 12, which also has the function of controlling access to these components.

The system memory 13, which is a storage medium that serves as main storage of the electronic apparatus, temporarily stores various programs executed by the CPU 11 and various pieces of data employed by these programs. One of the programs stored in the system memory 13 is a system management utility 100 which will be described later. The BIOS-ROM 14, which is a storage medium that stores the basic input/output system (BIOS), comprises a program-rewritable flash memory.

Various peripheral devices, such as a hard disk drive (HDD), an optical disk drive (ODD), etc., are connected to the PCI bus 2 through controllers 15, 16, etc. The SM bus 1 is used to inquire of the peripheral devices connected to the PCI bus 2 as to whether they are functioning correctly by way of example.

The temperature sensor 17 creates temperature data from status data output from the CPU 11 and then outputs it onto the SM bus 1 as being addressed to the bridge controller 12. The temperature data output onto the SM bus is received by the bridge controller 12 and stored into its built-in register. The system management utility 100 stored in the system memory 13 reads the temperature data from the bridge controller 12 at regular intervals and instructs the bridge controller 12 to rotate a cooling fan 21 when the temperature rises above a given temperature. This instruction process is performed by writing control data into the built-in register.

Suppose here that the threshold temperature at which the system management utility 100 causes the cooling fan 21 to commence rotating is set at 63° C.

Upon being instructed, the bridge controller 12 commands a fan voltage control circuit (1) 18 to output a drive voltage required for a fan drive circuit 20 to rotate the cooling fan 21. This instruction process is performed by the bridge controller inverting the potential on the control signal line connected between the fan voltage control circuit (1) 18 and it from a low level to a high level or vice versa.

Upon being instructed, the fan voltage control circuit (1) 18 commences to output a fan drive voltage. Here, this voltage is supposed to be 8V. The 8V drive voltage output from the fan voltage control circuit (1) 18 is applied through an OR circuit 19 to the fan drive circuit 20, so that the cooling fan 21 starts to rotate. The reason why the OR circuit 19 is interposed between the fan voltage control circuit (1) 18 and the fan drive circuit 20 will be described later.

If, after the cooling fan 21 has started to rotate, the temperature value read from the bridge controller 12 falls below the given value minus a margin of temperature, i.e., $(63-\alpha)°$ C., then the system management utility 100 instructs the bridge controller 12 to stop the cooling fan 21. The bridge controller 12 then instructs the fan voltage control circuit (1) 18 to stop outputting the drive voltage unlike when causing the cooling fan 21 to start to rotate. Thereby, the driving of the cooling fan 21 by the fan drive circuit 20 using the 8V drive voltage from the fan voltage control circuit (1) 18 is terminated.

Thus, with this electronic apparatus, basically the system management utility 100 which is software and the bridge controller 12 which is hardware cooperate with each other to implement the appropriate drive control of the cooling fan 21 based on the output of the temperature sensor 17.

Suppose here that a malfunction or lock-up has occurred in the system management utility 100 or a failure has occurred in the bridge controller 12, and as the result, a situation has been brought about in which no command is given to the fan voltage control circuit (1) to output a drive voltage of 8 volts although the temperature detected by the temperature sensor 17 has risen above 63° C.

To allow for such a situation, the electronic apparatus is equipped with a temperature comparator 22, a fan voltage control circuit (2) 23, and a light emitting diode (LED) 24 in addition to the OR circuit 19. The operating principles of these components will be described below in detail.

The temperature comparator 22 reads in temperature data from the temperature sensor 17 and, when the read value is above the given value, instructs the fan voltage control circuit (2) 23 to output a voltage required for the fan drive circuit 20 to rotate the cooling fan 21. As in the case where the bridge controller 12 instructs the fan voltage control circuit (1) 18 as described above, this instruction process is performed by inverting the potential on the control signal line connected to the fan voltage control circuit (2) 23 from a low level to a high level or vice versa. In this case, however, control of the fan voltage control circuit (2) 23 is performed by the temperature sensor 22 as opposed to the bridge controller 12, i.e., without intervention of the bridge controller.

The threshold temperature at which the temperature comparator 22 instructs the fan voltage control circuit (2) 23 to output the voltage is set higher than the threshold value at which the system management utility 100 causes the cooling fan 21 to commence rotating. More specifically, the threshold temperature is set to a temperature which will not be usually reached when the system management utility 100 and the bridge controller 12 cooperate with each other to control the cooling fan 21 appropriately and at which the CPU protective function will not commence to work. This temperature is set here at 69° C. That is, when the system composed of the system management utility 100, the bridge controller 12 and the fan voltage control circuit (1) 18 is functioning normally, the temperature detected by the temperature sensor 17 will not reach 69° C. In other words, in the case where the temperature detected by the temperature sensor 17 has reached 69° C., it is considered that a malfunction or lock-up has occurred in the system management utility 100 or a failure has occurred in the bridge controller 12. In this case, in order to increase the cooling effect of the cooling fan 21, the fan voltage control circuit (2) 23 outputs a voltage of, say, 12V, which is higher than the output voltage, 8V, of the fan voltage control circuit (1) 18.

The 12V output voltage of the fan voltage control circuit (2) 23 is applied through the OR circuit 19 to the fan drive circuit 20, which in turn causes the cooling fan 21 to rotate.

If, after the cooling fan 21 has started to rotate, the temperature value output from the temperature sensor 17 falls below the given value minus a margin of temperature $(69-\beta)°$ C., then the temperature comparator 22 instructs the fan voltage control circuit (2) 23 to stop outputting the drive voltage. Thereby, the driving of the cooling fan 21 by the fan drive circuit 20 using the 12V drive voltage from the fan voltage control circuit (2) 23 is terminated.

When the electronic apparatus is placed in a very special environment, it cannot exclude the possibility that, although the system composed of the system management utility 100, the bridge controller 12 and the fan voltage control circuit (1) 18 is functioning normally, the temperature detected by the temperature sensor 17 reaches 69° C. and consequently the fan voltage control circuit (2) 23 also commences to output the drive voltage. In this electronic apparatus, therefore, the OR circuit 19 is interposed between the fan drive circuit 20 and each of the fan voltage control circuits 18 and 23. When either the fan voltage control circuit (1) 18 or the fan voltage control circuit (2) 23 outputs a drive voltage, the OR circuit 19 applies it to the fan drive circuit 20. On the other hand, when each of the fan voltage control circuit (1) 18 and the fan voltage control circuit (2) 23 outputs a drive voltage, the OR circuit 19 applies the 12V drive voltage from the fan voltage control circuit (2) 23 to the fan drive circuit 20 in view of the situation in which the temperature has reached 69° C.

The fan voltage control circuit (2) 23, upon the commencement of outputting the drive voltage, causes the LED 24 to light in order to notify the user that a malfunction or lock-up may have occurred in the system management utility 100 or a failure may have occurred in the bridge controller 12. Even after the fan voltage control circuit (2) 23 has ceased to output the drive voltage, it continues to light the LED 24 in order to notify the user the fact that an abnormal situation has occurred.

Thus, this electronic apparatus allows the cooling fan 21 to be driven with certainty even in the case where a malfunction or lock-up has occurred in the system management utility 100 or a failure has occurred in the bridge controller 12 by simply adding the OR circuit 19, the temperature comparator 22, the fan voltage control circuit (2) 23, and the LED 24.

It is advisable to be able to arbitrarily set the threshold temperature (63° C.) held in the system management utility 100 and the threshold temperature (69° C.) held in the temperature comparator 22 according to installation environments. To this end, the system management utility 100 is provided with a user interface to allow the user to set the threshold temperature and the temperature comparator 22 is provided with an interface to accept the setting over the SM bus 1. The setting of the threshold value using the interface of the temperature comparator 22 is carried out by means of, for example, the BIOS stored in the BIOS-ROM 14.

Figure 2:
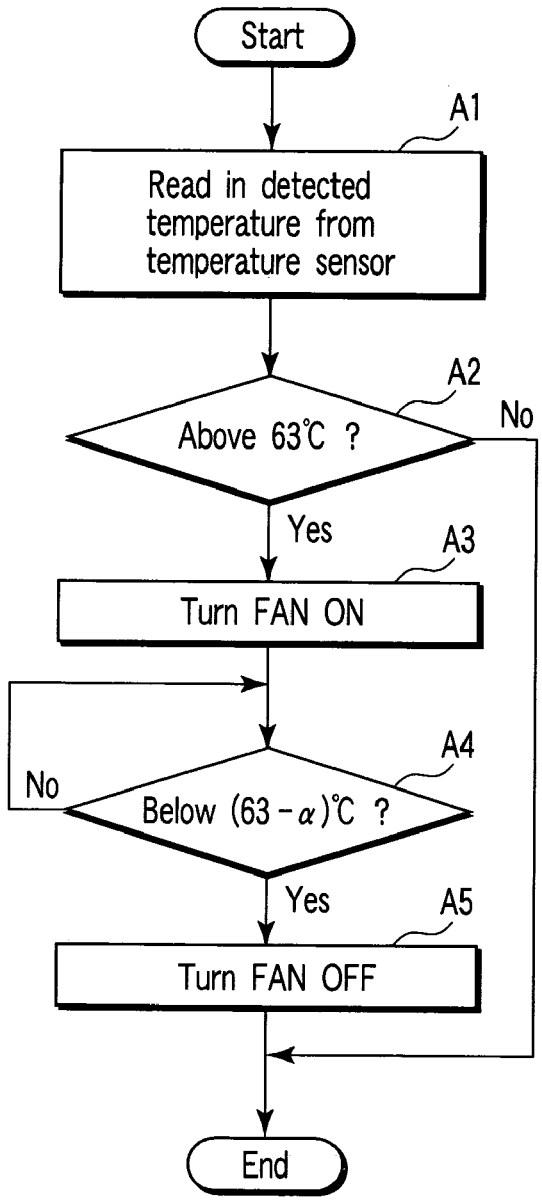
FIG. 2 is a flowchart for drive control of the cooling fan by the system management utility in the electronic apparatus of FIG. 1.
Figure 3:
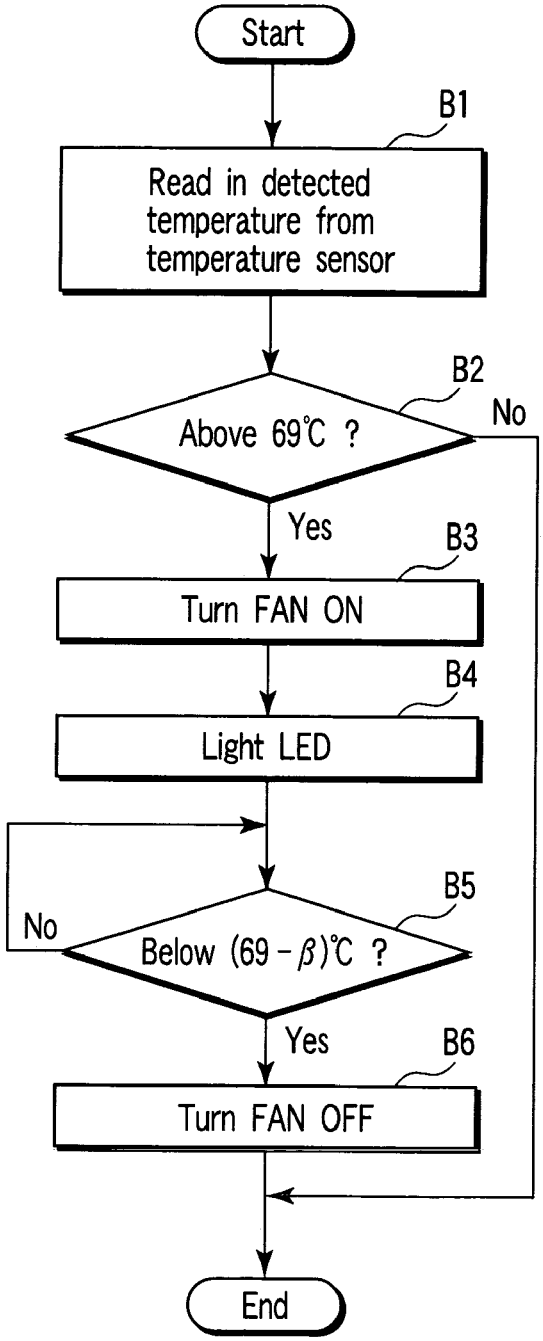
FIG. 3 is a flowchart for drive control of the cooling fan by the temperature comparator in the electronic apparatus of FIG. 1.

Reference is now made to flowcharts of FIGS. 2 and 3 to describe the flow of drive control of the cooling fan 21 in the electronic apparatus.

FIG. 2 is a flowchart illustrating the flow of drive control of the cooling fan 21 by the system management utility 100.

The system management utility 100 reads temperature data detected by the temperature sensor 17 from the bridge controller 12 (step A1) and then makes a decision of whether or not the temperature is above 63° C. (step A2). If the temperature is above 63° C. (YES in step A2), then the system management utility 100 instructs the bridge controller 12 to rotate the cooling fan 21 (step A3).

After instructing the bridge controller to rotate the cooling fan 21, the system management utility 100 makes a decision of whether or not the temperature detected by the temperature sensor 17 and read from the bridge controller 12 has fallen below $(63-\alpha)°$ C. (step A4). If the temperature has fallen below $(63-\alpha)°$ C. (YES in step A4), then the system management utility 100 instructs the bridge controller 12 to stop the cooling fan 21 (step A5).

FIG. 3 is a flowchart illustrating the flow of drive control of the cooling fan 21 by the temperature comparator 22.

The temperature comparator 22 reads in temperature data from the temperature sensor 17 (step B1) and then makes a decision of whether or not the temperature is above 69° C. (step B2). If the temperature is above 69° C. (YES in step B2), then the temperature comparator 22 instructs the fan voltage control circuit (2) 23 to output a drive voltage (step B3) and turns the LED 24 on (step B4).

After instructing the fan voltage control circuit to output a drive voltage, the temperature comparator 22 makes a decision of whether or not the temperature detected by the temperature sensor 17 has fallen below $(69-\beta)°$ C. (step B5). If the temperature has fallen below $(69-\beta)°$ C. (YES in step B5), then the temperature comparator 22 instructs the fan voltage control circuit (2) 23 to stop outputting the drive voltage (step B6).

As can be seen from the foregoing, the inventive electronic apparatus allows the cooling fan to be driven with certainty even at the time of software malfunction/lock-up or at the time of controller failure.

The embodiment has been described in terms of a specific example in which the system management utility 100 reads temperature data detected by the temperature sensor 17 from the bridge controller 12 at regular intervals and instructs the bridge controller 12 to rotate the cooling fan 21 if the read temperature has risen above 63° C. However, this is not restrictive. The embodiment may be modified such that the system management utility 100 sets 63° C. as a threshold temperature in the bridge controller 12 in initial procedure and, after that, the bridge controller that receives temperature data from the temperature sensor 17 drive controls the cooling fan 21 at its own discretion. Even in such a case, the control of the cooling fan 21 by the temperature controller 22 is useful.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
a fan drive circuit which drive controls a cooling fan;
first and second fan voltage control circuits each of which outputs a drive voltage required for the fan drive circuit to drive the cooling fan;
a temperature sensor;
a system controller which drive controls the first fan voltage control circuit on the basis of temperature data received from the temperature sensor; and
a temperature comparator which acquires the temperature data transferred toward the system controller and, when the temperature is above a given value, drive controls the second fan voltage control circuit to output the drive voltage without intervention of the system controller.

2. An electronic apparatus comprising:
a fan drive circuit which drive controls a cooling fan;
first and second fan voltage control circuits each of which outputs a drive voltage required for the fan drive circuit to rotate the cooling fan;
a logic circuit which is interposed between the fan drive circuit and each of the first and second fan voltage control circuits and, when a drive voltage is output from at least one of the first and second fan voltage control circuits, applies the drive voltage from the first or second fan voltage control circuit to the fan drive circuit;
a temperature sensor;
a system control circuit which receives temperature data detected by the temperature sensor over a system management bus and stores it and drive controls the first fan voltage control circuit;
a system management unit configured to read the temperature data detected by the temperature sensor from the system control circuit at regular intervals, and instruct the first fan voltage control circuit to output a drive voltage or stop outputting the drive voltage on the basis of the temperature data; and
a temperature comparator which reads the temperature data output from the temperature sensor to the system controller from the system management bus and, when the temperature is above a given value, drive controls the second fan voltage control circuit to output the drive voltage.

3. The electronic apparatus according to claim 2, wherein the system management unit is configured as a utility program which operates under the control of an operating system which executes resource management of the electronic apparatus.

4. The electronic apparatus according to claim 2, wherein the temperature comparator has a portion configured to accept an instruction over the system management bus and setting the given temperature.

5. The electronic apparatus according to claim 2, further comprising a display device and wherein the second fan voltage control circuit has a indicating portion configured to indicate the occurrence of an abnormal condition on the display device at the time of commencing to output the drive voltage.

6. The electronic apparatus according to claim 5, wherein the second fan voltage control circuit continues indication through the indicating portion even if it stops outputting the drive voltage.

7. The electronic apparatus according to claim 5, wherein the display device is an LED and the second fan voltage control circuit controls lighting of the LED.

8. The electronic apparatus according to claim 2, wherein the given temperature at which the temperature comparator causes the second fan voltage control circuit to commence to output the drive voltage is set higher than a temperature at which the system management unit causes the first fan voltage control circuit to commence to output the drive voltage, and the drive voltage output from the second fan voltage control circuit is set higher than the drive voltage output from the first fan voltage control circuit.

9. The electronic apparatus according to claim 8, wherein, when each of the first and second fan voltage control circuits outputs the drive voltage, the logic circuit applies the drive voltage output from the second fan voltage control circuit to the fan drive circuit.

* * * * *